(12) United States Patent
Hayashi et al.

(10) Patent No.: US 9,306,149 B2
(45) Date of Patent: Apr. 5, 2016

(54) PIEZOELECTRIC MATERIAL, PIEZOELECTRIC ELEMENT, LIQUID DISCHARGE HEAD, ULTRASONIC MOTOR, AND DUST REMOVING DEVICE

(75) Inventors: Jumpei Hayashi, Chofu (JP); Hisato Yabuta, Machida (JP); Makoto Kubota, Yokohama (JP); Mikio Shimada, Tokyo (JP); Satoshi Wada, Kofu (JP); Ichiro Fujii, Kofu (JP); Ryuta Mitsui, Kofu (JP); Nobuhiro Kumada, Kofu (JP)

(73) Assignees: Canon Kabushiki Kaisha, Tokyo (JP); University of Yamanashi, Kofu-shi (JP)

( * ) Notice: Subject to any disclaimer, the term of this patent is extended or adjusted under 35 U.S.C. 154(b) by 400 days.

(21) Appl. No.: 13/993,721

(22) PCT Filed: Dec. 22, 2011

(86) PCT No.: PCT/JP2011/080555
§ 371 (c)(1),
(2), (4) Date: Jun. 13, 2013

(87) PCT Pub. No.: WO2012/091147
PCT Pub. Date: May 7, 2012

(65) Prior Publication Data
US 2013/0270965 A1    Oct. 17, 2013

(30) Foreign Application Priority Data

Dec. 28, 2010  (JP) .................... 2010-292819
Sep. 6, 2011   (JP) .................... 2011-194072

(51) Int. Cl.
*H01L 41/187*  (2006.01)
*B41J 2/14*    (2006.01)
(Continued)

(52) U.S. Cl.
CPC ......... *H01L 41/1871* (2013.01); *B41J 2/14233* (2013.01); *C04B 35/26* (2013.01);
(Continued)

(58) Field of Classification Search
CPC ... H01L 41/18; H01L 41/187; H01L 41/1871; H01L 41/1878
USPC ............ 310/358; 252/62.9 R, 62.9 PZ
See application file for complete search history.

(56) References Cited

U.S. PATENT DOCUMENTS 8,216,858 B2   7/2012   Takashima et al.
8,258,679 B2   9/2012   Fukuoka
(Continued)

FOREIGN PATENT DOCUMENTS

CN  101549991 A  10/2009
CN  101624283 A   1/2010
(Continued)

OTHER PUBLICATIONS

Office Action in Korean Application No. 10-2013-7018722 (Sep. 22, 2014).
(Continued)

*Primary Examiner* — Derek Rosenau
(74) *Attorney, Agent, or Firm* — Fitzpatrick, Cella, Harper & Scinto

(57) ABSTRACT

Provided is a piezoelectric material that achieves both high piezoelectric performance and high Curie temperature. In addition, provided are a piezoelectric element, a liquid discharge head, an ultrasonic motor, and a dust removing device, which use the piezoelectric material. The piezoelectric material includes a perovskite-type metal oxide that is expressed by the following general formula (1): $xBaTiO_3$-$yBiFeO_3$-$zBi(M_{0.5}Ti_{0.5})O_3$ (1), where M represents at least one type of element selected from the group consisting of Mg and Ni, x satisfies $0.25 \leq x \leq 0.75$, y satisfies $0.15 \leq y \leq 0.70$, z satisfies $0.05 \leq z \leq 0.60$, and x+y+z=1 is satisfied.

14 Claims, 6 Drawing Sheets

(51) Int. Cl.
*C04B 35/468* (2006.01)
*G02B 27/00* (2006.01)
*H01L 41/09* (2006.01)
*H02N 2/10* (2006.01)
*H04N 5/217* (2011.01)
*C04B 35/26* (2006.01)
*C04B 35/475* (2006.01)
*C04B 35/626* (2006.01)
*C04B 35/632* (2006.01)
*C04B 35/634* (2006.01)
*C04B 35/638* (2006.01)
*H02N 2/16* (2006.01)

(52) U.S. Cl.
CPC ........... *C04B35/4682* (2013.01); *C04B 35/475* (2013.01); *C04B 35/6262* (2013.01); *C04B 35/6264* (2013.01); *C04B 35/632* (2013.01); *C04B 35/638* (2013.01); *C04B 35/63416* (2013.01); *C04B 35/63444* (2013.01); *G02B 27/0006* (2013.01); *H01L 41/09* (2013.01); *H01L 41/0973* (2013.01); *H01L 41/1878* (2013.01); *H02N 2/106* (2013.01); *H02N 2/163* (2013.01); *H04N 5/2171* (2013.01); *C04B 2235/3206* (2013.01); *C04B 2235/3232* (2013.01); *C04B 2235/3236* (2013.01); *C04B 2235/3262* (2013.01); *C04B 2235/3272* (2013.01); *C04B 2235/3279* (2013.01); *C04B 2235/3281* (2013.01); *C04B 2235/3298* (2013.01); *C04B 2235/442* (2013.01); *C04B 2235/5445* (2013.01); *C04B 2235/604* (2013.01); *C04B 2235/6025* (2013.01); *C04B 2235/768* (2013.01); *C04B 2235/77* (2013.01); *C04B 2235/782* (2013.01); *C04B 2235/785* (2013.01); *C04B 2235/786* (2013.01)

(56) References Cited

U.S. PATENT DOCUMENTS

| | | |
|---|---|---|
| 8,547,001 B2 | 10/2013 | Saito et al. |
| 2005/0188916 A1 | 9/2005 | Riman et al. |
| 2007/0138459 A1 | 6/2007 | Wong et al. |
| 2007/0241642 A1* | 10/2007 | Miyazawa et al. ............ 310/358 |
| 2009/0230211 A1* | 9/2009 | Kobayashi et al. .... 252/62.9 PZ |
| 2009/0243439 A1 | 10/2009 | Furukawa et al. |
| 2010/0231096 A1* | 9/2010 | Saito et al. .................... 310/365 |
| 2011/0193451 A1 | 8/2011 | Watanabe et al. |
| 2013/0056671 A1 | 3/2013 | Kubota et al. |
| 2013/0200750 A1 | 8/2013 | Watanabe et al. |

FOREIGN PATENT DOCUMENTS

| | | |
|---|---|---|
| JP | 2008-150247 A | 7/2008 |
| JP | 2008-179525 A | 8/2008 |
| WO | 2013/137421 A2 | 9/2013 |

OTHER PUBLICATIONS

Jiagang Wu et al., "Multiferroic Behaviour and Orientation Dependence of Lead-Free (1 −x)BiFeO3-x(Bi0.50Na0.50) TiO3 Thin Films," 42 J. Phys. D: Appl. Phys. 195405 (1-6) (Oct. 2009) (XP020163450).

N. Ortega et al., "Structural, Dielectric, Electrical and Magnetic Properties of Multiferroic BaTiO3-NiFe2O4 Composite Ceramic," 17th IEEE International Symposium on the Applications of Ferroelectrics, pp. 1-2 (Feb. 2008) (XP031868788).

M. Mahesh Kumar et al., "Structure Property Relations in BiFeO3/BaTiO3 Solid Solutions," 87(2) J. Appl. Phys. 855-862 (Jan. 2000).

Non-final Office Action in U.S. Appl. No. 13/599,689 (dated Sep. 26, 2014).

M. Dolgos et al., "Chemical Control of Octahedral Tilting and Off-Axis a Cation Displacement Allows Ferroelectric Switching in a Bismuth-Based Perovskite", 3 Chem. Sci. 1426-1435 (Feb. 2012).

Radheshyam Rai et al., "Multiferroic Properties of BiFeO3 Doped Bi(MgTi)O3—PbTiO3 Ceramic System," 506(2) J. Alloys Compd. 815-819 (Jul. 2010).

Office Action in Chinese Application No. 201180062602.4 (issued Mar. 18, 2014).

* cited by examiner

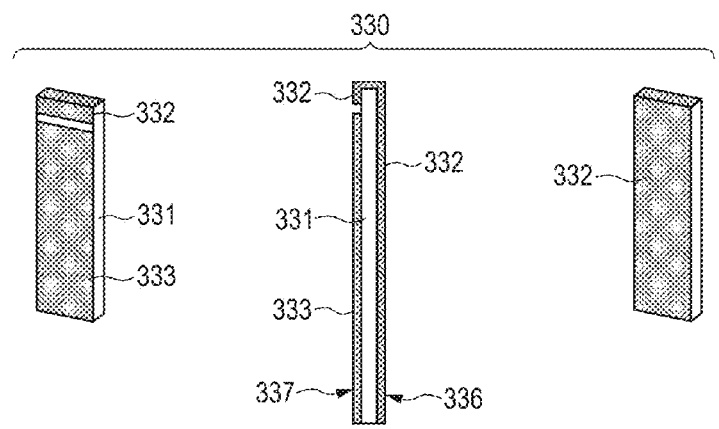
FIG. 6A    FIG. 6B    FIG. 6C
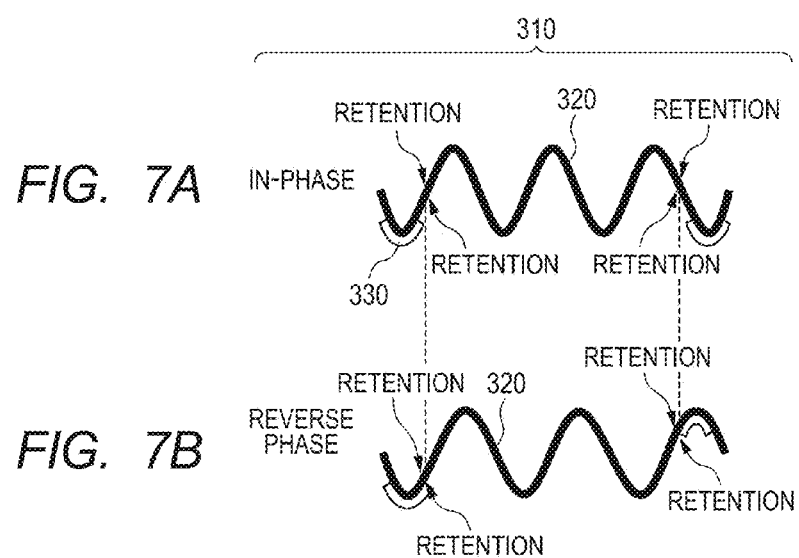
FIG. 7A
FIG. 7B

PIEZOELECTRIC MATERIAL, PIEZOELECTRIC ELEMENT, LIQUID DISCHARGE HEAD, ULTRASONIC MOTOR, AND DUST REMOVING DEVICE

TECHNICAL FIELD

The present invention relates to a piezoelectric material, and more particularly, to a lead-free piezoelectric material. The present invention also relates to a piezoelectric element, a liquid discharge head, an ultrasonic motor, and a dust removing device, which use the piezoelectric material.

BACKGROUND ART

A commonly used piezoelectric material is an $ABO_3$-type perovskite metal oxide such as lead titanate zirconate (hereinafter, referred to as "PZT"). However, it is considered that PZT, which contains lead as an A-site element, may cause environmental problems. Therefore, a piezoelectric material with a lead-free perovskite-type metal oxide has been desired.

Barium titanate is known as a piezoelectric material with a lead-free perovskite-type metal oxide. Patent Literature 1 discloses barium titanate prepared by a resistance heating/two-step sintering technique. The patent literature describes that a ceramic with excellent piezoelectric property can be obtained when nano-sized barium titanate powder is sintered by the two-step sintering technique. However, the barium titanate has a problem that it is not suitable for device operation at high temperature because its Curie temperature is low at 125° C.

In addition, Non-Patent Literature 1 discloses a solid solution of barium titanate and bismuth ferrite as an attempt to increase the Curie temperature of barium titanate. However, as the solid solution amount of the bismuth ferrite increases, the Curie temperature increases while piezoelectric performance is conspicuously decreased.

In other words, it is difficult to achieve both high piezoelectric performance and high Curie temperature in a piezoelectric material of the lead-free perovskite-type metal oxide.

CITATION LIST

Patent Literature

PTL 1: Japanese Patent Application Laid-Open No. 2008-150247
NPL 1: "Journal of Applied Physics" 2008, Volume 87, Issue 2, pp. 855-862

SUMMARY OF INVENTION

Technical Problem

The present invention has been made to address such a problem, and an object thereof is to provide a piezoelectric material that can achieve both high piezoelectric performance and high Curie temperature. In addition, the present invention provides a piezoelectric element, a liquid discharge head, an ultrasonic motor, and a dust removing device, which use the piezoelectric material.

Solution to Problem

According to the present invention, there is provided a piezoelectric material, including a perovskite-type metal oxide that is expressed by the following general formula (1): $xBaTiO_3$-$yBiFeO_3$-$zBi(M_{0.5}Ti_{0.5})O_3$, where M represents at least one type of element selected from the group consisting of Mg and Ni, x satisfies $0.25 \leq x \leq 0.75$, y satisfies $0.15 \leq y \leq 0.70$, z satisfies $0.05 \leq z \leq 0.60$, and $x+y+z=1$ is satisfied. According to the present invention, there is provided a piezoelectric material, including a perovskite-type metal oxide that is expressed by the following general formula (2): $xBaTiO_3$-$yBiFeO_3$-$zBi(M_{0.5}Ti_{0.5})O_3$, where M represents at least one type of element selected from the group consisting of Mg and Ni, x satisfies $0.10 \leq x < 0.25$, y satisfies $0.15 \leq y \leq 0.30$, z satisfies $0.45 \leq z \leq 0.75$, and $x+y+z=1$ is satisfied.

According to the present invention, there is provided a piezoelectric material, including a perovskite-type metal oxide that is expressed by the following general formula (3): $lBaTiO_3$-$mBiFeO_3$-$nBi(M_{0.5}Ti_{0.5})O_3$, where M represents at least one type of element selected from the group consisting of Mg and Ni, l satisfies $0<l<1$, m satisfies $0<m<1$, n satisfies $0<n<1$, and $l+m+n=1$ is satisfied, in which the piezoelectric material is a ceramic, and crystal grains of the ceramic have a diffuse phase transition structure.

According to the present invention, there is provided a piezoelectric element, including: a first electrode; a piezoelectric material; and a second electrode, in which the piezoelectric material includes the above-mentioned piezoelectric material.

A liquid discharge head according to the present invention uses the above-mentioned piezoelectric element.

An ultrasonic motor according to the present invention uses the above-mentioned piezoelectric element.

A dust removing device according to the present invention uses the above-mentioned piezoelectric element.

Advantageous Effects of Invention

According to the present invention, it is possible to provide a piezoelectric material that achieves both high piezoelectric performance and high Curie temperature. Through the use of the piezoelectric material of the present invention, it is possible to provide a liquid discharge head having nozzle density and discharge performance equal to or higher than those in the case where a piezoelectric material including lead is used.

Through the use of the piezoelectric material of the present invention, it is possible to provide an ultrasonic motor having driving power and durability equal to or higher than those in the case where a piezoelectric material including lead is used. Through the use of the piezoelectric material of the present invention, it is possible to provide a dust removing device having dust removing efficiency equal to or higher than that in the case where a piezoelectric material including lead is used.

BRIEF DESCRIPTION OF DRAWINGS

FIGS. 6A, 6B and 6C are schematic diagrams illustrating a structure of a piezoelectric element of the present invention illustrated in FIGS. 5A and 5B.

FIGS. 7A and 7B are schematic diagrams illustrating a principle of vibration of the dust removing device of the present invention.

DESCRIPTION OF EMBODIMENTS

Figure 1A:
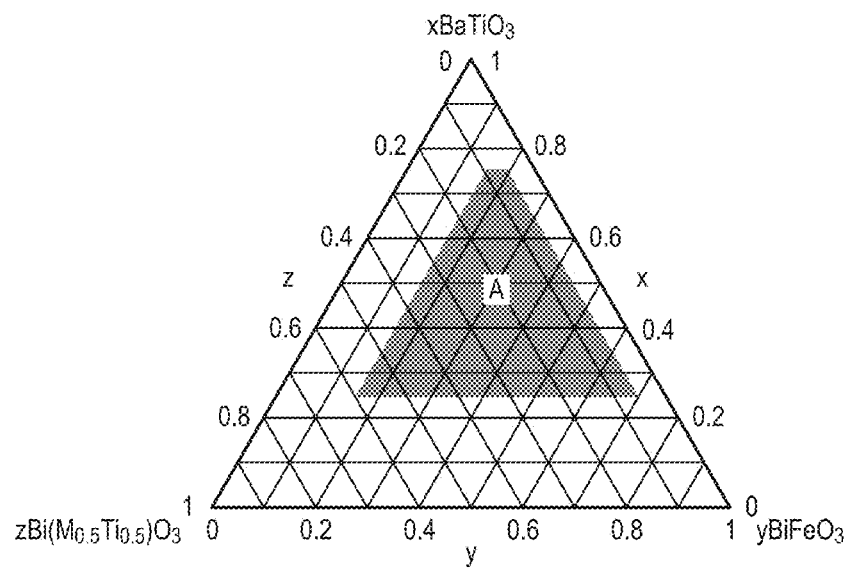
FIGS. 1A and 1B are phase diagrams illustrating an embodiment of a piezoelectric material of the present invention.

Hereinafter, embodiments of the present invention are described.

According to the present invention, there is provided a piezoelectric material, including a perovskite-type metal oxide that is expressed by the following general formula (1): $xBaTiO_3$-$yBiFeO_3$-$zBi(M_{0.5}Ti_{0.5})O_3$ (1), where M represents at least one type of element selected from the group consisting of Mg and Ni, x satisfies $0.25 \leq x \leq 0.75$, y satisfies $0.15 \leq y \leq 0.70$, z satisfies $0.05 \leq z \leq 0.60$, and $x+y+z=1$ is satisfied. According to the present invention, there is also provided a piezoelectric material, including a perovskite-type metal oxide that is expressed by the following general formula (2): $xBaTiO_3$-$yBiFeO_3$-$zBi(M_{0.5}Ti_{0.5})O_3$ (2), where M represents at least one type of element selected from the group consisting of Mg and Ni, x satisfies $0.10 \leq x \leq 0.25$, y satisfies $0.15 \leq y \leq 0.30$, z satisfies $0.45 \leq z \leq 0.75$, and $x+y+z=1$ is satisfied.

The perovskite-type metal oxide of the present invention refers to a metal oxide having a perovskite-type structure that is ideally a cubic structure as described in Iwanami Physico-chemical Dictionary, Fifth Edition (Iwanami Shoten, published on Feb. 20, 1998). The metal oxide having a perovskite-type structure is generally expressed by chemical formula of $ABO_3$. In the perovskite-type metal oxide, the elements A and B occupy specific positions in a form of ions in a unit cell, which are called A site and B site. For instance, in a cubic unit cell, the element A is positioned at a vertex of the cube while the element B is positioned at the body center. The element O occupies a face center position as an anion of oxygen.

The metal oxide expressed by the general formula (1) refers to a solid solution of three perovskite-type metal oxides that are expressed by $BaTiO_3$, $BiFeO_3$, and $Bi(M_{0.5}Ti_{0.5})O_3$. In the general formula (1), a metal element positioned at the A site is mainly Ba and Bi, and a metal element positioned at the B site is at least one type of element selected from the group consisting of Ti, Fe, Mg, and Ni.

In the general formula (1), an element content ratio between the A site and the B site is expressed as 1:1. However, even if the element content ratio is shifted slightly, a single phase state constituted of only the perovskite-type structure is included within the scope of the present invention. For instance, in a lead type piezoelectric material, it is well known that an actual B-site element ratio is often shifted from a stoichiometric ratio when A-site Pb is excessively used or in a composite perovskite-type structure.

It is determined that the piezoelectric material is the perovskite-type structure from structure analysis using X-ray diffraction or electron diffraction, for example.

In the general formula (1), the range of x that represents abundance of $BaTiO_3$ satisfies $0.25 \leq x \leq 0.75$. Preferably, $0.25 \leq x \leq 0.55$ is satisfied. In addition, in the general formula (2), the range of x satisfies $0.10 \leq x < 0.25$. If x is smaller than 0.10, a crystal phase other than the perovskite-type structure (hereinafter, this crystal phase is referred to as a "secondary phase") may occur. On the other hand, if x is larger than 0.75, the Curie temperature becomes lower than 200° C., and thus piezoelectric property may disappear in a high temperature region. In this specification, the Curie temperature refers to the temperature at which ferroelectricity disappears. As a method of specifying the Curie temperature, there are a method of directly measuring the temperature at which ferroelectricity disappears while changing measuring temperature, and a method in which a dielectric constant is measured by using micro alternating magnetic field of a certain frequency while changing measuring temperature to thereby determine the temperature at which the dielectric constant becomes maximum.

A desirable Curie temperature in piezoelectric material of the present invention is 200° C. or higher and 500° C. or lower, more preferably, 200° C. or higher and 450° C. or lower. If the Curie temperature is 200° C. or higher, it is possible to provide a material with little characteristic variation when the material is used in a device. In addition, if the Curie temperature is 500° C. or lower, it is possible to provide a material that is easy to polarize when the material is used in an element.

In the general formula (1), the range of y representing abundance of $BiFeO_3$ satisfies $0.15 \leq y \leq 0.70$. Preferably, $0.20 \leq y \leq 0.70$ is satisfied. In addition, in the general formula (2), the range of y satisfies $0.15 \leq y \leq 0.30$. If y is smaller than 0.15, there occurs a problem for the following reason, regardless of what value x takes. Specifically, if y is smaller than 0.15 and x is 0.5 or larger, the Curie temperature may be decreased. In addition, if x is smaller than 0.5, the secondary phase may be generated. On the other hand, if y is larger than 0.70, insulation property may be deteriorated.

In the general formula (1), the range of z representing abundance of $Bi(M_{0.5}Ti_{0.5})O_3$ satisfies $0.05 \leq z \leq 0.60$. Preferably, $0.05 \leq z \leq 0.25$ is satisfied. In addition, in the general formula (2), the range of z satisfies $0.45 \leq z \leq 0.75$. If z is smaller than 0.05, there occurs a problem for the following reason, regardless of what value x takes. Specifically, if z is smaller than 0.05 and x is 0.5 or larger, the Curie temperature may be decreased. In addition, if x is smaller than 0.5, the insulation property may be deteriorated. On the other hand, if z is larger than 0.75, the secondary phase may occur.

In the general formula (1), M in $Bi(M_{0.5}Ti_{0.5})O_3$ represents at least one type of element selected from the group consisting of Mg and Ni. M may be only Mg or only Ni, or may include both Mg and Ni. Mg and Ni are divalent, and form a pseudo-trivalent ion with tetravalent Ti, with the result that it is possible to achieve charge balance with trivalent Bi. In this case, it is preferred that a ratio between M and Ti be 1:1. In addition, in the general formula (1), element contents of M and Ti in $Bi(M_{0.5}Ti_{0.5})O_3$ are both expressed as 0.5. However, even if this element content is shifted to a value in the range of 0.4 to 0.6, a single phase state constituted of only the perovskite-type structure is included in the scope of the present invention.

In addition, the piezoelectric material of the present invention may include characteristic adjustment components and impurity components that are included in the manufacturing process.

In the general formula (1), M represents at least one type of element selected from the group consisting of Mg and Ni. When $0.25 \leq x \leq 0.75$, $0.15 \leq y \leq 0.70$, and $0.05 \leq z \leq 0.60$ are satisfied, a piezoelectric constant $d_{33}$* is 100 (pm/V) or larger, and the Curie temperature is 200° C. or higher. Here, FIG. 1 is a phase diagram of one embodiment of the piezoelectric material of the present invention, and the above-mentioned ranges are expressed by a region A in this diagram.

In this specification, the piezoelectric constant $d_{33}$ is a constant determined from electric field and distortion gradient of an electric field distortion curve. Here, mark * is added for the following reason. The piezoelectric constant $d_{33}$ that is usually used shows piezoelectric property only in 33-direction. In contrast, in this calculation method, there is a slight possibility of contribution to directions other than the 33-direction. The piezoelectric material according to the present invention satisfies $0.25 \leq x \leq 0.55$, $0.2 \leq y \leq 0.70$, and $0.05 \leq z \leq 0.25$ in the general formula (1).

In the general formula (1), M is at least one type of element selected from the group consisting of Mg and Ni. When $0.25 \leq x \leq 0.55$, $0.2 \leq y \leq 0.70$, and $0.05 \leq z \leq 0.25$ are satisfied, the piezoelectric constant $d_{33}*$ is 200 (pm/V) or larger, and the Curie temperature is 200° C. or higher. Here, the above-mentioned ranges are expressed by a range B in FIG. 1.

Figure 9:
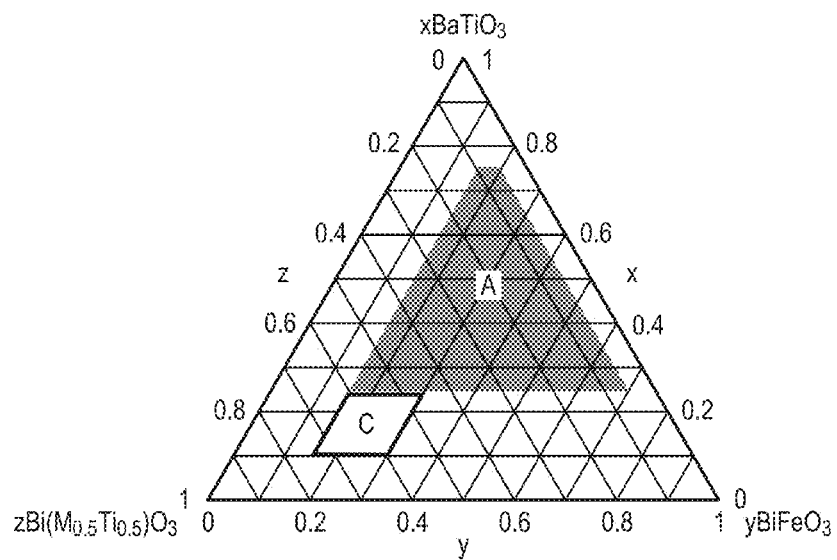
FIG. 9 is a phase diagram illustrating a composition of the piezoelectric material of the present invention.

FIG. 9 illustrates the above-mentioned region A indicating composition of the piezoelectric material of the present invention, and illustrates a range C that indicates composition of the piezoelectric material of the present invention similarly and is expressed by the general formula (2). The piezoelectric material of the present invention having the composition corresponding to the range C expressed by the general formula (2) has a piezoelectric constant $d_{33}*$ of 100 (pm/V) or larger and a Curie temperature of 200° C. or higher.

The piezoelectric material of the present invention contains at least one type selected from the group consisting of Mn and Cu, and hence insulation property and density of the piezoelectric material are improved. If the insulation property of the piezoelectric material is improved, it is possible to endure a polarization process in which high electric field is applied. Thus, conversion efficiency between electric energy and mechanical energy is improved. In addition, if the density of the piezoelectric material is improved, piezoelectric property and mechanical strength are improved.

It is preferred that the piezoelectric material according to the present invention contain at least one type of element selected from the group consisting of manganese (Mn) and copper (Cu) at 0.05 mass % or higher and 3.0 mass % or lower. If the amount of at least one type of element selected from the group consisting of Mn and Cu is smaller than 0.05 mass %, improvement of insulation property and density may be decreased, and if the amount is larger than 3.0 mass %, the secondary phase may be generated.

A raw material to be used for Mn and Cu contained in the piezoelectric material of the present invention is not limited particularly. In the case of Mn, a divalent Mn compound or a tetravalent Mn compound may be used. Similarly, in the case of Cu, a monovalent Cu compound or a divalent Cu compound may be used. In addition, solid powder or liquid raw material may be used. Examples of Mn raw material include manganese oxide, manganese dioxide, manganese acetate, and manganese carbonate. Examples of Cu material include copper oxide and copper nitrate.

In addition, positions of Mn and Cu contained in the piezoelectric material of the present invention are not limited particularly. Mn and Cu may be contained at the B site of the perovskite-type structure or may be contained as an oxide at a crystal grain boundary so that the same effect can be expected. As to the piezoelectric material according to the present invention, it is preferred that the piezoelectric material be a ceramic, that an average equivalent circular diameter of crystal grains of the ceramic is 500 nm or larger and 5 μm or smaller, and that a maximum equivalent circular diameter of the crystal grains is 5 μm or larger and 10 μm or smaller.

The term "ceramic" used herein refers to an aggregate (also referred to as bulk) of crystal particles sintered by thermal treatment, or the so-called polycrystal, in which the main component thereof is a metal oxide. The term also includes one processed after sintering. However, the term does not include any powder or powder-dispersed slurry.

The "equivalent circular diameter" used herein refers to a "projected area equivalent circular diameter" that is generally mentioned in a microscopic observation method and indicates a diameter of a circle having the same area as a projected area of the crystal grain. In the present invention, this method of measuring the equivalent circular diameter is not limited particularly. For instance, the equivalent circular diameter can be determined by photographing a surface of the piezoelectric ceramic using a polarizing microscope or a scanning electron microscope, and by performing image processing on the obtained photographic image. An enlarging magnification when the equivalent circular diameter of the crystal grain is determined is, for example, approximately 5 to 5,000. An optical microscope and an electron microscope may be used selectively depending on the magnification. It is possible to determine the equivalent circular diameter not from an image of a surface of the ceramic but from an image of a polished surface or a cross-section.

The "average equivalent circular diameter" used herein refers to an average value of the equivalent circular diameter obtained by performing image processing on the photographic image obtained by photographing the piezoelectric ceramic. The average value may be a volume average or a number average, but the number average is preferred.

The "maximum equivalent circular diameter" used herein refers to a maximum value of the equivalent circular diameter obtained by performing image processing on the photographic image obtained by photographing the piezoelectric ceramic.

It is preferred that the average equivalent circular diameter of the crystal grains be 500 nm or larger and 5 μm or smaller. In this range, there is a merit that a diffusion phase transition structure described later easily exists in the crystal grains of the piezoelectric material. On the other hand, if the average equivalent circular diameter is smaller than 500 nm, the density may be decreased so that sufficient piezoelectric property cannot be obtained. In addition, if the average equivalent circular diameter is larger than 5 μm, mechanical strength may be deteriorated.

Further, it is preferred that the maximum equivalent circular diameter of the crystal grains be 5 μm or larger and 10 μm or smaller. In this range, there is a merit that a diffusion phase transition structure described later easily exists in the crystal grains of the piezoelectric material. On the other hand, if the average equivalent circular diameter is smaller than 5 μm, the density may be decreased so that sufficient piezoelectric property cannot be obtained. In addition, if the average equivalent circular diameter is larger than 10 μm, mechanical strength may be deteriorated.

As to the piezoelectric material of the present invention, it is preferred that the piezoelectric material be a ceramic and that crystal grains constituting the ceramic have the diffusion phase transition structure.

Figure 2A:
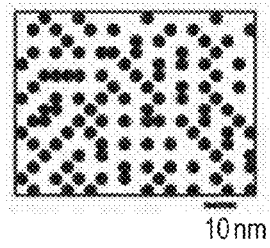
FIGS. 2A, 2B, and 2C are conceptual diagram of a microstructure inside crystal grains of the piezoelectric material of the present invention.
Figure 2B:
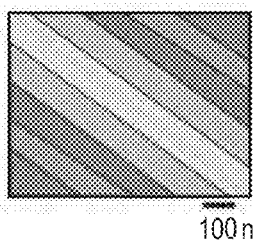
Figure 2C:
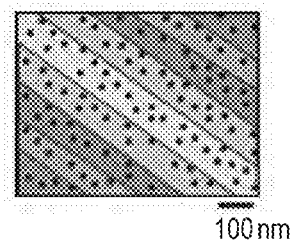

If the structure analysis using a transmission type electron microscope (TEM) is performed on the piezoelectric material of the present invention, it is understood that a microstructure of the crystal grains is different depending on the composition region. FIGS. 2A to 2C are conceptual diagrams of the microstructure of the crystal grains in the piezoelectric material of the present invention, and the microstructure is described with reference to FIGS. 2A to 2C. As the microstructure of the crystal grains, there are three types: a composition region illustrated in FIG. 2A called a polar nano region (hereinafter, referred to as PNR), in which a very local region with spontaneous polarizations of several nanometers in random directions is dominant; a composition region illustrated in FIG. 2B (hereinafter, referred to as a "domain region"), in which a region with spontaneous polarizations of several tens to several hundreds of nanometers in random directions is dominant; and a composition region illustrated in FIG. 2C, in which the PNR exists in the domain region. In the present invention, the microstructure illustrated in FIG. 2C in which the PNR exists in the domain region is referred to as a "diffuse phase transition structure (Diffuse Phase Transition)". In addition, the region illustrated in FIG. 2A is also called a relaxor region.

Next, what composition region this microstructure exists in is described with reference to FIGS. 1A and 1B.

Figure 1B:
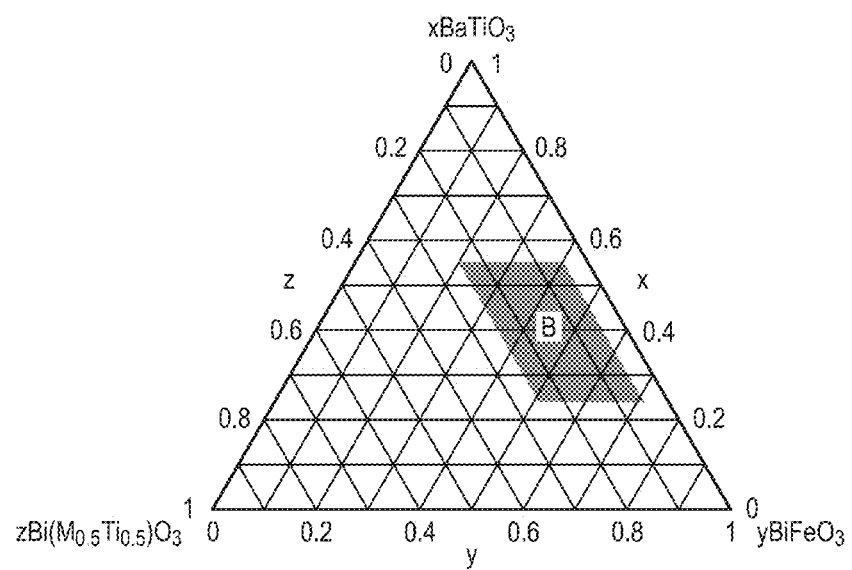

The region in which the PNR is dominant exists in the range of y=0 and x≤0.5 and in the range of z=0 and x≥0.4 illustrated in FIGS. 1A and 1B. Because coercive electric field is small in this region, there is a feature that good displacement response to the electric field is obtained. In addition, the piezoelectric property is apt to increase. However, frequency dispersion of the dielectric constant is large, and hence the piezoelectric property becomes unstable with respect to the frequency even at a constant temperature. This is not preferred.

The domain region exists in the range of y=0 and x>0.5 and in the range of z=0 and x<0.4 illustrated in FIGS. 1A and 1B. In this region, a structure of the domain to be an origin of the piezoelectric property is stable, and hence the piezoelectric property is stable at a constant temperature. However, because the coercive electric field is large, displacement response to an applied electric field may be slow. This is not preferred.

The diffusion phase transition structure exists in the region A illustrated in FIG. 1A. This region has both the feature that the piezoelectric property of the region in which the PNR is dominant is high and the feature that the piezoelectric property of the domain region is stable. This is preferred. As a specific characteristic, the piezoelectric property $d_{33}^*$ is 100 (pm/V) or higher, and the Curie temperature is 200° C. or higher.

The piezoelectric material of the present invention is a piezoelectric material made of a perovskite-type metal oxide expressed by the following general formula (3):

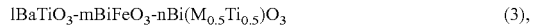

$$lBaTiO_3\text{-}mBiFeO_3\text{-}nBi(M_{0.5}Ti_{0.5})O_3 \qquad (3),$$

where M represents at least one type of element selected from the group consisting of Mg and Ni, l satisfies 0<l<1, m satisfies 0<m<1, n satisfies 0<n<1, and l+m+n=1 is satisfied. Further, the piezoelectric material is a ceramic, and crystal grains of the ceramic have the diffusion phase transition structure.

Because the crystal grains have the diffusion phase transition structure, the piezoelectric property is high and stable, and further the Curie temperature is high.

In the general formula (3), the element content ratio between the A site and the B site is expressed as 1:1. However, even if the element content ratio is shifted to approximately 0.9:1.1, the single phase state constituted of only the perovskite-type structure is included within the scope of the present invention.

In addition, a manufacturing method for the piezoelectric material of the present invention is not limited particularly.

When manufacturing a ceramic, it is possible to adopt a general method of sintering a solid powder of oxide, carbonate, nitrate, oxalate, and the like at a normal pressure. In addition, it is possible to use a method of cutting the sintered ceramic and overlaying the same to be adhered or a tape casting method of making ceramic powders in a sheet-like shape and overlaying the same so that a multilayered structure is achieved.

The raw material is made of a metal compound such as barium (Ba) compound, titanium (Ti) compound, bismuth (Bi) compound, iron (Fe) compound, magnesium (Mg) compound, nickel (Ni) compound, Mn compound, and Cu compound.

Examples of usable Ba compound include barium oxide, barium carbonate, barium oxalate, barium acetate, barium nitrate, and barium titanate.

Examples of usable Ti compound include titanium oxide.

Examples of usable Bi compound include bismuth oxide and bismuth nitrate.

Examples of usable Fe compound include iron oxide, iron chloride, and iron nitrate.

Examples of usable Mg compound include magnesium oxide, magnesium oxalate, magnesium chloride, and magnesium carbonate.

Examples of usable Ni compound include nickel oxide, nickel nitrate, nickel chloride, and nickel oxalate.

Examples of usable Mn compound include manganese carbonate, manganese oxide, manganese dioxide, and manganese acetate.

Examples of usable Cu compound include copper oxide, copper nitrate, and copper sulfate.

In addition, the sintering method is not limited particularly. Examples of the sintering method include a sintering method using an electric furnace, an electric heating method, a microwave sintering method, a millimeter wave sintering method, and a hot isostatic pressing (HIP) method.

The sintering temperature is not limited but is preferably a temperature at which crystals of the piezoelectric ceramic can sufficiently grow. A preferred sintering temperature is 800° C. or higher and 1,150° C. or lower, more preferably 900° C. or higher and 1,030° C. or lower. The piezoelectric ceramic sintered at a temperature in the above-mentioned range shows a good piezoelectric property.

In order to stabilize the characteristic of the piezoelectric ceramic obtained by the sintering process, it is preferred to maintain the sintering temperature to be constant in the above-mentioned range to perform the sintering process for an hour or longer and 24 hour or shorter. A relative density of the sintered piezoelectric ceramic is preferably 90% or higher, more preferably 95% or higher. This is because, if the relative density is lower than 90%, a relative dielectric constant of the piezoelectric ceramic is conspicuously decreased, and the mechanical strength is also decreased. Examples of means for increasing relative density include a method of adding manganese or copper and a method of using the tape casting method to make a compact.

Hereinafter, a piezoelectric element using the piezoelectric material of the present invention is described.

The piezoelectric element according to the present invention is a piezoelectric element including at least a first electrode, a piezoelectric material, and a second electrode, and the piezoelectric material is the above-mentioned piezoelectric material.

The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the first electrode and the second electrode may be formed of one kind of those materials, or may be obtained by laminating two or more kinds thereof. The first electrode and the second electrode may be formed of different materials, respectively.

A manufacturing method for the first electrode and the second electrode is not limited. The first electrode and the second electrode may be formed by baking a metal paste or by sputtering, vapor deposition, or the like. In addition, both the first electrode and the second electrode may be patterned in desired shapes for use.

Figure 3A:
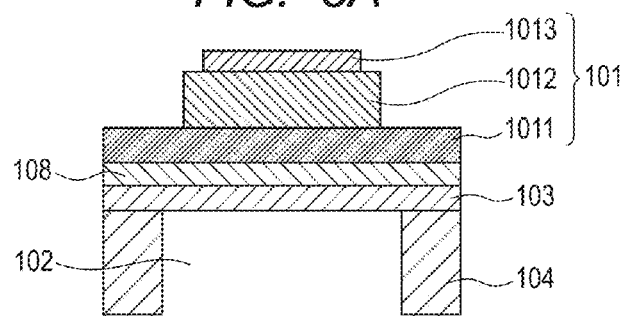
FIGS. 3A and 3B are schematic diagrams illustrating an embodiment of a structure of a liquid discharge head of the present invention.
Figure 3B:
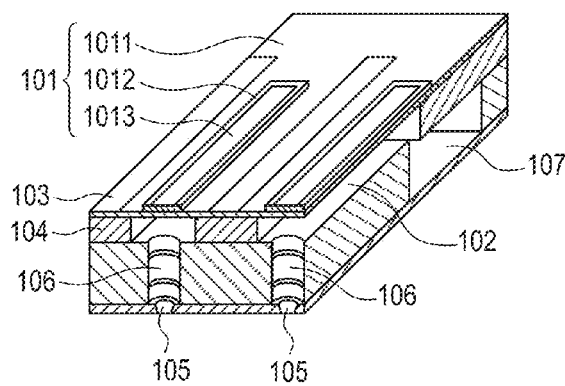

FIGS. 3A and 3B are each a schematic view illustrating an embodiment of the construction of a liquid discharge head of the present invention. As illustrated in FIGS. 3A and 3B, the liquid discharge head of the present invention is a liquid discharge head including a piezoelectric element 101 of the present invention. The piezoelectric element 101 is a piezoelectric element including at least a first electrode 1011, a piezoelectric material 1012, and a second electrode 1013. The piezoelectric material 1012 is patterned as required as illustrated in FIG. 3B.

FIG. 3B is a schematic view of the liquid discharge head. The liquid discharge head includes discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which is of a rectangular shape in FIG. 3B, may be of a shape except the rectangular shape such as an elliptical shape, a circular shape, or a parallelogram shape. In general, the piezoelectric material 1012 are each of a shape in conformity with the shape of the individual liquid chamber 102.

The vicinity of the piezoelectric element 101 included in the liquid discharge head of the present invention is described in detail with reference to FIG. 3A. FIG. 3A is a sectional view of the piezoelectric element in the width direction of the liquid discharge head illustrated in FIG. 3B. The sectional shape of the piezoelectric element 101, which is illustrated in a rectangular shape, may be a trapezoidal shape or a reverse trapezoidal shape. In FIG. 3A, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name are caused by a manufacturing method for the device and an effect of the present invention can be obtained in any case.

In the liquid discharge head, the diaphragm 103 vertically fluctuates owing to the expansion and contraction of the piezoelectric material 1012 to apply a pressure to liquid in the individual liquid chamber 102. As a result, the liquid is discharged from the discharge port 105. The liquid discharge head of the present invention can be used in a printer application or the manufacture of an electronic device.

The diaphragm 103 has a thickness of 1.0 μm or more and 15 μm or less, preferably 1.5 μm or more and 8 μm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more and 300 nm or less, preferably 10 nm or more and 200 nm or less.

The size of the discharge port 105 is 5 μm or more and 40 μm or less in terms of a equivalent circular diameter. The shape of the discharge port 105 may be a circular shape, or may be a star shape, a square shape, or a triangular shape.

Next, an ultrasonic motor using the piezoelectric element of the present invention is described.

Figure 4A:
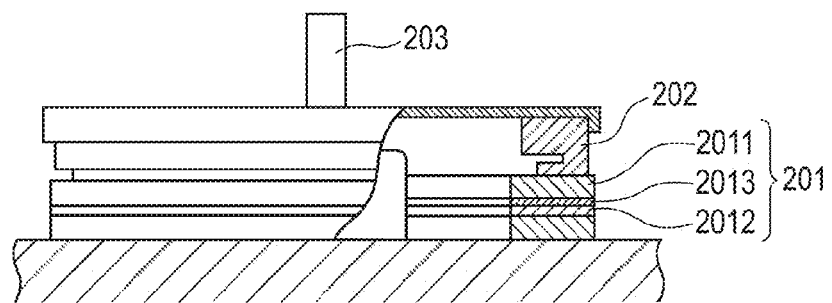
FIGS. 4A and 4B are schematic diagrams illustrating an embodiment of a structure of an ultrasonic motor of the present invention.
Figure 4B:
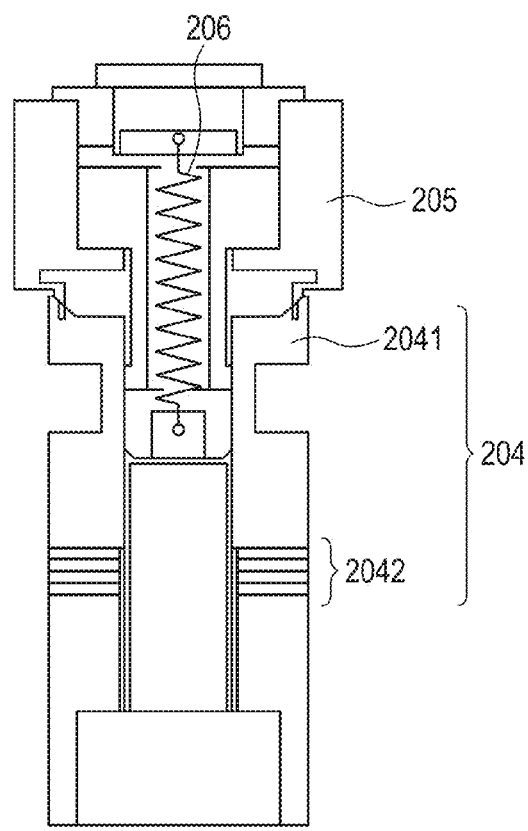

FIGS. 4A and 4B are schematic views illustrating an embodiment of the construction of the ultrasonic motor of the present invention.

FIG. 4A illustrates an ultrasonic motor in which the piezoelectric element of the present invention is formed of a single plate. The ultrasonic motor includes a transducer 201, a rotor 202 brought into contact with the sliding surface of the transducer 201 by virtue of a pressure applied from a pressurizing spring (not shown), and an output axis 203 provided so as to be integral with the rotor 202. The transducer 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of a piezoelectric material interposed between a first electrode (not shown) and a second electrode (not shown).

The application of two alternating voltages different from each other in phase by $\pi/2$ to the piezoelectric element of the present invention results in the generation of a bending travelling wave in the transducer 201, and hence each point on the sliding surface of the transducer 201 undergoes an elliptical motion. When the rotor 202 is brought into press contact with the sliding surface of the transducer 201, the rotor 202 receives a frictional force from the transducer 201 to rotate in the direction opposite to the bending travelling wave. A body to be driven (not shown) is joined to the output axis 203, and is driven by the rotary force of the rotor 202.

The application of a voltage to the piezoelectric material results in the expansion and contraction of the piezoelectric material due to a piezoelectric transverse effect. When an elastic body such as a metal is joined to the piezoelectric element, the elastic body is bent by the expansion and contraction of the piezoelectric material. The ultrasonic motor of the kind described here utilizes the principle.

Next, an ultrasonic motor including a piezoelectric element having a laminated structure is illustrated in FIG. 4B. A transducer 204 is formed of a laminated piezoelectric element 2042 interposed between tubular metal elastic bodies 2041. The laminated piezoelectric element 2042 is an element formed of multiple laminated piezoelectric materials (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the transducer 204 is formed.

The application of alternating voltages different from each other in phase to the piezoelectric element 2042 causes the transducer 204 to excite two vibrations orthogonal to each other. The two vibrations are synthesized to form a circular vibration for driving the tip portion of the transducer 204. Note that, a constricted circumferential groove is formed in the upper portion of the transducer 204 to enlarge the displacement of the vibration for driving.

A rotor 205 is brought into contact with the transducer 204 under a pressure from a spring 206 for pressurization to obtain a frictional force for driving. The rotor 205 is rotatably supported by a bearing.

Next, a dust removing device using the piezoelectric element of the present invention is described.

Figure 5A:
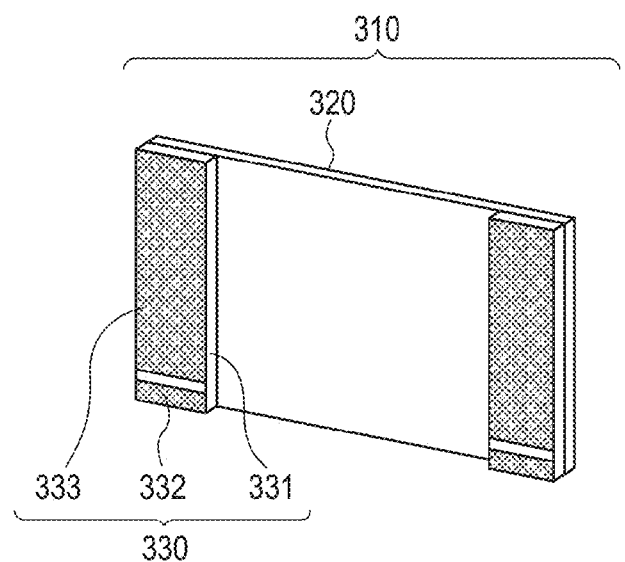
FIGS. 5A and 5B are schematic diagrams illustrating an embodiment of a dust removing device of the present invention.
Figure 5B:
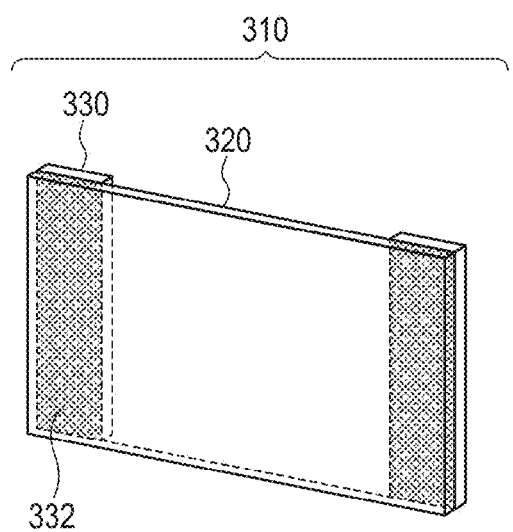

FIGS. 5A and 5B are schematic diagrams illustrating an embodiment of the dust removing device of the present invention. A dust removing device 310 includes a plate-like piezoelectric element 330 and a diaphragm 320. The material of the diaphragm 320 is not limited. In the case where the dust removing device 310 is used for an optical device, a transparent material or a reflective material can be used as the material of the diaphragm 320. The piezoelectric element 330 includes a piezoelectric material 331, a first electrode 332, and a second electrode 333.

FIGS. 6A to 6C are schematic diagrams illustrating a structure of the piezoelectric element 330 illustrated in FIGS. 5A and 5B. FIGS. 6A and 6C illustrate a front surface structure and a rear surface structure of the piezoelectric element 330, respectively. FIG. 6B illustrates a side surface structure. As illustrated in FIGS. 6A to 6C, the piezoelectric element 330 includes the piezoelectric material 331, the first electrode 332, and the second electrode 333. The first electrode 332 and the second electrode 333 are disposed so as to be opposed to the plate surfaces of the piezoelectric material 331. In FIG. 6C, the front surface of the piezoelectric element 330 on which the first electrode 332 is disposed is referred to as a first electrode surface 336. In FIG. 6A, the front surface of the piezoelectric element 330 on which the second electrode 333 is disposed is referred to as a second electrode surface 337.

Here, the electrode surface in the present invention means a surface of the piezoelectric element on which the electrode is disposed. For instance, as illustrated in FIGS. 6A to 6C, the first electrode 332 may extend around to the second electrode surface 337.

As illustrated in FIGS. 5A and 5B, as for the piezoelectric element 330 and the diaphragm 320, the plate surface of the diaphragm 320 is fixed to the first electrode surface 336 of the piezoelectric element 330. When the piezoelectric element 330 is driven, a stress is generated between the piezoelectric element 330 and the diaphragm 320, so that out-of-plane vibration is generated in the diaphragm. The dust removing device 310 of the present invention is a device that removes foreign matters such as dust sticking to the surface of the diaphragm 320 by the out-of-plane vibration of the diaphragm 320. The out-of-plane vibration means elastic vibration in which the diaphragm moves in the optical axis direction, namely in the thickness direction of the diaphragm.

FIGS. 7A and 7B are schematic diagrams illustrating a vibration principle of the dust removing device 310 of the present invention. FIG. 7A illustrates a state in which alternating electric fields having the same phase are applied to a pair of left and right piezoelectric elements 330 so that the out-of-plane vibration is generated in the diaphragm 320. The polarization direction of the piezoelectric ceramic forming the pair of left and right piezoelectric elements 330 is the same as the thickness direction of the piezoelectric elements 330, and the dust removing device 310 is driven by the seventh vibrational mode. FIG. 7B illustrates a state in which alternating voltages having opposite phases by 180 degrees are applied to the pair of left and right piezoelectric elements 330 so that the out-of-plane vibration is generated in the diaphragm 320. The dust removing device 310 is driven by the sixth vibrational mode. The dust removing device 310 of the present invention is a device that can effectively remove dust sticking to the surface of the diaphragm by using at least two vibrational modes selectively.

As described above, the piezoelectric element of the present invention is suitably applicable to the liquid discharge head, the ultrasonic motor, and the dust removing device.

The present invention provides a novel piezoelectric material that can achieve both high piezoelectric performance and high Curie temperature. Note that, the piezoelectric material of the present invention can be used in various applications such as material for capacitors, material for memories, and material for sensors, utilizing its characteristic as dielectric.

Through the use of the piezoelectric material of the present invention, it is possible to provide the liquid discharge head having the same or higher nozzle density and discharge force than the case where the piezoelectric material containing lead is used.

Through the use of the piezoelectric material of the present invention, it is possible to provide the ultrasonic motor having the same or higher driving force and durability than the case where the piezoelectric material containing lead is used.

Through the use of the piezoelectric material of the present invention, it is possible to provide the dust removing device having the same or higher dust-removing efficiency than the case where the piezoelectric material containing lead is used.

The piezoelectric material of the present invention can be used in such a device as an ultrasonic transducer, a piezoelectric actuator, a piezoelectric sensor, and a ferroelectric memory, as well as the liquid discharge head and the motor.

Hereinafter, the piezoelectric material of the present invention is described more specifically by way of examples. However, the present invention is not limited by the following examples.

Example of $BaTiO_3$—$BiFeO_3$—$Bi(Mg_{0.5}Ti_{0.5})O_3$

Examples 1 to 16, and Comparative Examples 1 to 6

(Manufacturing Method)

As raw materials, barium titanate (manufactured by Sakai Chemical Industry Co., Ltd.; grain size is 100 nm), bismuth oxide (manufactured by Rare Metallic Co., Ltd.; purity is 99.999%), iron oxide (manufactured by Rare Metallic Co., Ltd.; purity is 99.9%), magnesium oxide (manufactured by Rare Metallic Co., Ltd.; purity is 99.9%), and titanium oxide (manufactured by Ishihara Sangyo Kaisha, Ltd.; purity is 99.9%) were used. Composition of Table 1 was achieved by weighing, ethanol was used as solvent, and wet mixing was performed in a ball mill for 24 hours. After that, drying was performed at 80° C., and the mixed powder was calcined at a temperature of 800 to 900° C. for 6 hours. The calcined powder was crushed and the ball mill wet mixing was performed again using ethanol as solvent for 16 hours. After that, polyvinyl alcohol (PVA) was added by 2 mass % as a binder, the ball mill mixing was performed for 1 hour, and then drying was performed at 80° C. so that granulated powder was obtained.

Next, the obtained granulated powder was crushed and particle size selection was performed with a sieve of 250 μm mesh. The obtained powder after the particle size selection was filled in a mold and was pressed uniaxially by 200 MPa pressure, so as to make a disc-like compact having a diameter of 10 mm.

Then, the binder was removed from the obtained compact at 700° C. for 10 hours, and the compact was sintered at a temperature of 900 to 1,000° C. for 6 hours so that a sintered body was obtained. After that, the obtained sintered body was polished to have a thickness of 0.4 mm.

(Structure Evaluation)

The composition of the polished sintered body was evaluated by X-ray fluorescence analysis (XRF) in which a calibration curve is formed by ICP weight analysis. A crystal structure of the sintered body was evaluated by 2θ–θ measurement of the X-ray diffraction (XRD). In addition, detailed structure analysis was performed using a TEM.

Density of the sintered body was evaluated by Archimedes method. The relative density was determined as a ratio of a measure value of the density to a theoretical density determined from the crystal structure analysis of the X-ray diffraction measurement. The average equivalent circular diameter and the maximum equivalent circular diameter of the crystal grains of the sintered body were observed by the SEM, and the average equivalent circular diameter was determined as the number average.

(Electric Characteristic Evaluation)

In order to evaluate electric characteristic of the polished sintered body, the sintered body was processed in a strip shape having a thickness of 0.4 mm, a length of 15 mm, and a width of 4 mm, and silver electrodes were formed on the front and back surface so as to make a piezoelectric element.

The piezoelectric property was evaluated by determining the piezoelectric constant $d_{33}$* from the electric field and the distortion gradient of the electric field distortion curve. As a distortion value, a value when an electric field of 60 kV/cm was applied was adopted, and the piezoelectric constant was calculated.

In addition, the Curie temperature was determined from a peak position of temperature characteristic of the dielectric constant. The temperature characteristic of the dielectric constant was determined by measuring the dielectric constant at 1 MHz every 10° C. while increasing temperature at 3° C. per minute.

Results of those evaluations are shown in Table 1. In Table 1, composition columns x, y, and z indicate molar ratios of $BaTiO_3$, $BiFeO_3$, and $Bi(Mg_{0.5}Ti_{0.5})O_3$, respectively. In the crystal structure column, a state in which only the perovskite-type structure exists is indicated by "○", and a state in which the secondary phase exists is indicated by "×".

Figure 8:
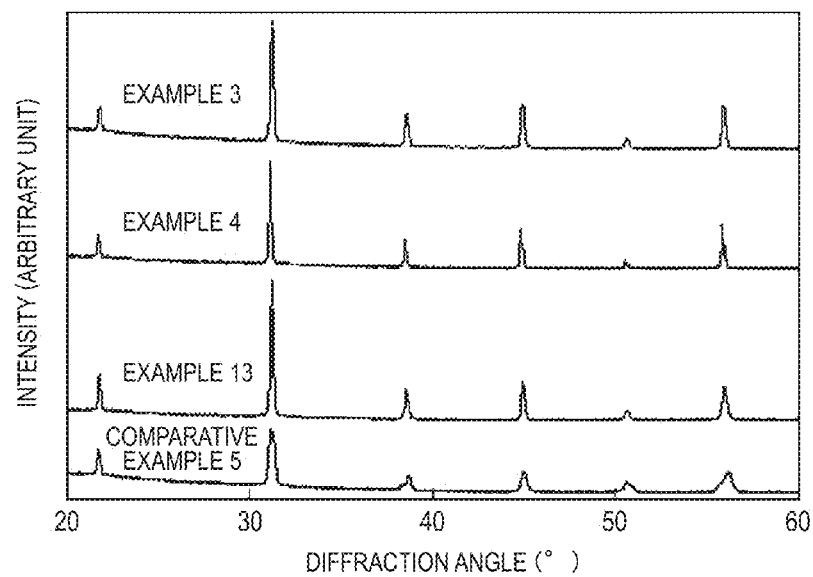
FIG. 8 is an X-ray diffraction pattern of Examples 3, 4, and 13 and Comparative Example 5.

From the result of the fluorescent X-ray analysis, it was found that the composition was as weighed after sintering, too. In the structure evaluation, it was found that only the perovskite-type structure existed in examples except for Comparative Example 6 from the X-ray diffraction structure analysis (2θ–θ measurement). Here, X-ray diffraction patterns of Examples 3, 4, and 13, and Comparative Example 5 are illustrated in FIG. 8. In addition, the density was 90% or higher as relative density in all having only the perovskite-type structure. Further, in the samples of examples, the average equivalent circular diameter of crystal grains was 0.5 μm or larger and 5.0 μm or smaller, and the maximum equivalent circular diameter of crystal grains was 5.2 μm or larger and 9.8 μm or smaller. Then, as a result of the structure analysis using the TEM, the diffuse phase transition structure was confirmed in all the samples of examples. As to comparative examples, the PNR was dominant in Comparative Examples 1, 2, 3, and 6, while the domain region was dominant in Comparative Examples 4 and 5.

As to the electric characteristic, the piezoelectric constant $d_{33}$* was 100 (pm/V) or larger, and the Curie temperature was 200° C. or higher in all the samples in the composition ranges of the examples.

Examples 17 to 23

Materials Containing Mn or Cu (Manufacturing Method)

As raw materials, barium titanate (manufactured by Sakai Chemical Industry Co., Ltd.; grain size is 100 nm), bismuth oxide (manufactured by Rare Metallic Co., Ltd.; purity is 99.999%), iron oxide (manufactured by Rare Metallic Co., Ltd.; purity is 99.9%), magnesium oxide (manufactured by Rare Metallic Co., Ltd.; purity is 99.9%), titanium oxide (manufactured by Ishihara Sangyo Kaisha, Ltd.; purity is 99.9%), manganese carbonate, and copper oxide were used.

TABLE 1

| | Composition | | | Crystal structure | Structure evaluation | | | Electric characteristic | |
| --- | --- | --- | --- | --- | --- | --- | --- | --- | --- |
| | | | | | Relative Density [%] | Average equivalent circular diameter [μm] | Maximum equivalent circular diameter [μm] | Piezoelectric constant $d_{33}$* [pm/V] | Curie temperature (° C.) |
| | x | y | z | | | | | | |
| Example 1 | 0.75 | 0.15 | 0.10 | ○ | 92 | 0.5 | 5.2 | 180 | 200 |
| Example 2 | 0.75 | 0.20 | 0.05 | ○ | 91 | 2.1 | 6.3 | 160 | 210 |
| Example 3 | 0.70 | 0.20 | 0.10 | ○ | 93 | 2.0 | 6.2 | 190 | 210 |
| Example 4 | 0.60 | 0.30 | 0.10 | ○ | 92 | 2.2 | 6.4 | 150 | 230 |
| Example 5 | 0.55 | 0.20 | 0.25 | ○ | 91 | 2.0 | 6.1 | 200 | 220 |
| Example 6 | 0.55 | 0.40 | 0.05 | ○ | 91 | 2.9 | 7.2 | 250 | 290 |
| Example 7 | 0.50 | 0.40 | 0.10 | ○ | 92 | 2.6 | 7.1 | 230 | 290 |
| Example 8 | 0.45 | 0.35 | 0.20 | ○ | 91 | 2.5 | 6.9 | 340 | 300 |
| Example 9 | 0.40 | 0.20 | 0.40 | ○ | 92 | 1.5 | 5.7 | 100 | 200 |
| Example 10 | 0.40 | 0.30 | 0.30 | ○ | 91 | 2.7 | 6.5 | 170 | 340 |
| Example 11 | 0.40 | 0.45 | 0.15 | ○ | 91 | 3.1 | 7.5 | 290 | 280 |
| Example 12 | 0.30 | 0.20 | 0.50 | ○ | 92 | 1.4 | 5.8 | 120 | 390 |
| Example 13 | 0.30 | 0.60 | 0.10 | ○ | 92 | 3.6 | 8.2 | 250 | 440 |
| Example 14 | 0.25 | 0.15 | 0.60 | ○ | 92 | 0.5 | 5.3 | 105 | 400 |
| Example 15 | 0.25 | 0.50 | 0.25 | ○ | 92 | 5.0 | 9.8 | 220 | 380 |
| Example 16 | 0.25 | 0.70 | 0.05 | ○ | 93 | 4.7 | 9.1 | 210 | 450 |
| Comparative Example 1 | 0.80 | 0.10 | 0.10 | ○ | 91 | 0.4 | 3.9 | 160 | 70 |
| Comparative Example 2 | 0.50 | 0.10 | 0.40 | ○ | 92 | 0.4 | 4.2 | 55 | 240 |
| Comparative Example 3 | 0.40 | 0.10 | 0.50 | ○ | 90 | 0.3 | 3.1 | 70 | 260 |
| Comparative Example 4 | 0.20 | 0.40 | 0.40 | ○ | 91 | 8.6 | 20.1 | 65 | 510 |
| Comparative Example 5 | 0.20 | 0.70 | 0.10 | ○ | 91 | 7.9 | 17.5 | 40 | 520 |
| Comparative Example 6 | 0.10 | 0.10 | 0.80 | × | 82 | 7.8 | 16.2 | Cannot evaluate | Cannot evaluate |

Composition of Table 2 was achieved by weighing, and the sintered body was manufactured by the same method as in Examples 1 to 16.
(Structure Evaluation)

As to the polished sintered body, through the use of the same method as in Examples 1 to 16, the composition, the crystal structure, the density, and the average equivalent circular diameter and the maximum equivalent circular diameter of the crystal grains were evaluated.
(Electric Characteristic Evaluation)

The electric characteristic of the polished sintered body was evaluated by the same method as in Examples 1 to 16.

Results of those evaluations are shown in Table 2. In Table 2, composition columns x, y, and z indicate molar ratios of $BaTiO_3$, $BiFeO_3$, and $Bi(Mg_{0.5}Ti_{0.5})O_3$, respectively. In addition, Mn quantity and Cu quantity respectively indicate masses with respect to 100 parts by mass of $xBaTiO_3$-$yBiFeO_3$-$zBi(Mg_{0.5}Ti_{0.5})O_3$. Further, in the crystal structure column, a state in which only the perovskite-type structure exists is indicated by "○".

Metallic Co., Ltd.; purity is 99.9%), and titanium oxide (manufactured by Ishihara Sangyo Kaisha, Ltd.; purity is 99.9%) were used. Composition of Table 3 was achieved by weighing, and wet mixing was performed in the ball mill for 24 hours using ethanol as a solvent. After that, drying was performed at 80° C., and the mixed powder was calcined at a temperature of 750 to 850° C. for 6 hours. The calcined powder was crushed, and wet mixing was performed again in the ball mill for 16 hours using ethanol as a solvent. Next, the mixed powder was dried at 80° C., and then was calcined again at a temperature of 850 to 900° C. for 6 hours. After that, PVA was added as a binder by 2 mass %, and the ball mill mixing was performed for 1 hour. After that, drying was performed at 80° C., and then granulated powder was obtained. Next, the obtained granulated powder was crushed, and particle size selection was performed with a sieve of 250 μm mesh. The obtained powder after the particle size selection was filled in a mold and was pressed uniaxially by 200 MPa pressure, so as to make a disc-like compact having a diameter of 10 mm.

TABLE 2

| | Composition | | | | | Structure evaluation | | Electric characteristic | |
|---|---|---|---|---|---|---|---|---|---|
| | x | y | z | Mn quantity (mass %) | Cu quantity (mass %) | Crystal structure | Relative Density [%] | Piezoelectric constant $d_{33}$* [pm/V] | Curie temperature (° C.) |
| Example 17 | 0.75 | 0.15 | 0.10 | 0.05 | 0.00 | ○ | 95 | 190 | 200 |
| Example 18 | 0.75 | 0.20 | 0.05 | 0.00 | 0.05 | ○ | 94 | 180 | 210 |
| Example 19 | 0.60 | 0.30 | 0.10 | 0.50 | 0.00 | ○ | 95 | 160 | 230 |
| Example 20 | 0.50 | 0.40 | 0.10 | 0.60 | 0.50 | ○ | 94 | 240 | 290 |
| Example 21 | 0.40 | 0.20 | 0.40 | 3.00 | 0.00 | ○ | 94 | 110 | 200 |
| Example 22 | 0.30 | 0.20 | 0.50 | 1.00 | 1.00 | ○ | 94 | 130 | 390 |
| Example 23 | 0.25 | 0.15 | 0.60 | 0.00 | 3.00 | ○ | 95 | 120 | 400 |

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 94% or higher as relative density in all the samples, which is a higher value than that in Examples 1 to 16 without manganese or copper. Then, the average equivalent circular diameter and the maximum equivalent circular diameter of crystal grains were evaluated in all the samples. The average equivalent circular diameter was 1.0 μm or larger and 4.2 μm or smaller, and the maximum equivalent circular diameter was 5.4 μm or larger and 9.9 μm or smaller. Further, as a result of the structure analysis using the TEM, the diffuse phase transition structure was confirmed in all the samples.

As to the electric characteristic, the piezoelectric constant $d_{33}$* was 110 (pm/V) or larger, and the Curie temperature was 200° C. or higher in all the samples.

Example of $BaTiO_3$—$BiFeO_3$—$Bi(Ni_{0.5}Ti_{0.5})O_3$

Examples 24 to 33, and Comparative Examples 7 to 10

(Manufacturing Method A: Common Sintering Method)

As raw materials, barium titanate (manufactured by Sakai Chemical Industry Co., Ltd.; grain size is 100 nm), bismuth oxide (manufactured by Rare Metallic Co., Ltd.; purity is 99.999%), iron oxide (manufactured by Rare Metallic Co., Ltd.; purity is 99.9%), nickel oxide (manufactured by Rare Then, the binder was removed from the obtained compact at 500° C. for 10 hours, and the compact was sintered at a temperature of 950 to 1,030° C. for 6 hours so that a sintered body was obtained. After that, the obtained sintered body was polished to have a thickness of 0.4 mm.
(Manufacturing Method B: Tape Casting Method)

As raw materials, barium titanate (manufactured by Sakai Chemical Industry Co., Ltd.; grain size is 100 nm), bismuth oxide (manufactured by Rare Metallic Co., Ltd.; purity is 99.999%), iron oxide (manufactured by Rare Metallic Co., Ltd.; purity is 99.9%), nickel oxide (manufactured by Rare Metallic Co., Ltd.; purity is 99.9%), and titanium oxide (manufactured by Ishihara Sangyo Kaisha, Ltd.; purity is 99.9%) were used. Composition of Table 3 was achieved by weighing, and wet mixing was performed in the ball mill for 24 hours using ethanol as a solvent. After that, drying was performed at 80° C., and the mixed powder was calcined at a temperature of 750 to 850° C. for 6 hours. The calcined powder was crushed, and wet mixing was performed again in the ball mill for 16 hours using ethanol as a solvent. Next, the mixed powder was dried at 80° C., and then was calcined again at a temperature of 850 to 900° C. for 6 hours. After that, mixed solution of 55 vol % toluene and 45 vol % ethanol was added to the mixed powder to be 90 mass %. To this, polyvinyl pyrrolidone (PVP) having an average molecular weight of 400,000 as a binder and plasticizer (butyl phthalate) were added by 6 mass % each to the powder quantity. The wet mixing of this mixture was performed in the ball mill for 5 hours to make slurry. Next, using a doctor blade device, the slurry was formed into a tape-like shape having a thickness of 40 to 45 μm and was dried. Further, this tape was cut into pieces of 2×2 cm² size, and 40 pieces of them were laminated and were bonded by pressure of 100 kg/cm² (9.8 MPa) at 80° C. for 10 minutes so that a compact having a thickness of 1.8 mm was obtained.

Then, the binder was removed from the obtained compact at 650° C. for 10 hours, and the compact was sintered at a temperature of 950 to 1,030° C. for 6 hours so that a sintered body was obtained. After that, the obtained sintered body was polished to have a thickness of 0.4 mm.

Structure Evaluation

As to the polished sintered body, through the use of the same method as in Examples 1 to 23, the composition, the crystal structure, the density, and the average equivalent circular diameter and the maximum equivalent circular diameter of the crystal grains were evaluated.

(Electric Characteristic Evaluation)

The electric characteristic of the polished sintered body was evaluated by the same method as in Examples 1 to 23.

Results of those evaluations are shown in Table 3. In Table 3, composition columns x, y, and z indicate molar ratios of $BaTiO_3$, $BiFeO_3$, and $Bi(Ni_{0.5}Ti_{0.5})O_3$, respectively. In the crystal structure column, a state in which only the perovskite-type structure exists is indicated by "○", and a state in which the secondary phase exists is indicated by "×".

PNR was dominant in Comparative Examples 7 and 8, while the domain region was dominant in Comparative Examples 9 and 10.

As to the electric characteristic, the piezoelectric constant $d_{33}*$ was 105 (pm/V) or larger, and the Curie temperature was 200° C. or higher in all the samples in the composition ranges of the examples.

Examples 34 to 39

Materials Containing Mn or Cu (Manufacturing Method)

As raw materials, barium titanate (manufactured by Sakai Chemical Industry Co., Ltd.; grain size is 100 nm), bismuth oxide (manufactured by Rare Metallic Co., Ltd.; purity is 99.999%), iron oxide (manufactured by Rare Metallic Co., Ltd.; purity is 99.9%), nickel oxide (manufactured by Rare Metallic Co., Ltd.; purity is 99.9%), titanium oxide (manufactured by Ishihara Sangyo Kaisha, Ltd.; purity is 99.9%), manganese carbonate, and copper oxide were used. Composition of Table 4 was achieved by weighing, and the sintered body was manufactured by the same method as in Examples 1 to 33.

TABLE 3

| | Manufacturing method | Composition | | | Crystal structure | Structure evaluation | | | Electric characteristic | |
| --- | --- | --- | --- | --- | --- | --- | --- | --- | --- | --- |
| | | x | y | z | | Relative Density [%] | Average equivalent circular diameter [μm] | Maximum equivalent circular diameter [μm] | Piezoelectric constant $d_{33}*$ [pm/V] | Curie temperature (° C.) |
| Example 24 | A | 0.75 | 0.15 | 0.10 | ○ | 91 | 0.9 | 6.5 | 135 | 200 |
| Example 25 | A | 0.75 | 0.20 | 0.05 | ○ | 92 | 3.0 | 8.1 | 120 | 220 |
| Example 26 | A | 0.60 | 0.30 | 0.10 | ○ | 92 | 3.3 | 7.9 | 105 | 240 |
| Example 27 | A | 0.55 | 0.20 | 0.25 | ○ | 92 | 2.9 | 6.1 | 160 | 220 |
| Example 28 | B | 0.55 | 0.40 | 0.05 | ○ | 98 | 3.8 | 7.2 | 190 | 280 |
| Example 29 | B | 0.50 | 0.40 | 0.10 | ○ | 97 | 3.7 | 7.1 | 170 | 300 |
| Example 30 | B | 0.45 | 0.35 | 0.20 | ○ | 97 | 3.9 | 8.4 | 240 | 290 |
| Example 31 | A | 0.30 | 0.60 | 0.10 | ○ | 91 | 2.1 | 7.4 | 180 | 420 |
| Example 32 | A | 0.25 | 0.50 | 0.25 | ○ | 92 | 5.0 | 9.8 | 160 | 360 |
| Example 33 | B | 0.25 | 0.70 | 0.05 | ○ | 98 | 4.8 | 8.6 | 155 | 430 |
| Comparative Example 7 | A | 0.80 | 0.10 | 0.10 | ○ | 91 | 0.3 | 3.9 | 110 | 60 |
| Comparative Example 8 | A | 0.50 | 0.10 | 0.40 | ○ | 91 | 0.4 | 4.2 | 40 | 230 |
| Comparative Example 9 | B | 0.20 | 0.70 | 0.10 | ○ | 97 | 9.1 | 21.1 | 35 | 500 |
| Comparative Example 10 | A | 0.10 | 0.10 | 0.80 | × | 82 | 8.9 | 20.2 | Cannot evaluate | Cannot evaluate |

From a result of the fluorescent X-ray analysis, it was found that the composition was as weighed after sintering, too.

In the structure evaluation, it was found from the X-ray diffraction structure analysis that only the perovskite-type structure existed in the examples except for Comparative Example 10. In addition, the density was 90% or higher as relative density in all having only the perovskite-type structure, and it is understood that the relative density increased as 97% or higher by using the tape casting method. Further, in the samples of the examples, the average equivalent circular diameter of crystal grains was 0.9 μm or larger and 5.0 μm or smaller, and the maximum equivalent circular diameter of crystal grains was 6.1 μm or larger and 9.8 μm or smaller. Then, as a result of the structure analysis using the TEM, the diffuse phase transition structure was confirmed in all the samples of the examples. As to the comparative examples, the (Structure Evaluation)

As to the polished sintered body, through the use of the same method as in Examples 1 to 33, the composition, the crystal structure, the density, and the average equivalent circular diameter and the maximum equivalent circular diameter of the crystal grains were evaluated.

(Electric Characteristic Evaluation)

The electric characteristic of the polished sintered body was evaluated by the same method as in Examples 1 to 33.

Results of those evaluations are shown in Table 4. In Table 4, composition columns x, y, and z indicate molar ratios of $BaTiO_3$, $BiFeO_3$, and $Bi(Ni_{0.5}Ti_{0.5})O_3$, respectively. In addition, Mn quantity and Cu quantity respectively indicate masses with respect to 100 parts by mass of $xBaTiO_3$-$yBiFeO_3$-$zBi(Ni_{0.5}Ti_{0.5})O_3$. Further, in the crystal structure column, a state in which only the perovskite-type structure exists is indicated by "○".

TABLE 4

| | Composition | | | | | Structure evaluation | | Electric characteristic | |
|---|---|---|---|---|---|---|---|---|---|
| | x | y | z | Mn quantity (mass %) | Cu quantity (mass %) | Crystal structure | Relative Density [%] | Piezoelectric constant $d_{33}$* [pm/V] | Curie temperature (° C.) |
| Example 34 | 0.75 | 0.15 | 0.10 | 0.50 | 0.00 | ○ | 95 | 120 | 200 |
| Example 35 | 0.75 | 0.20 | 0.05 | 0.00 | 0.50 | ○ | 96 | 105 | 220 |
| Example 36 | 0.60 | 0.30 | 0.10 | 0.90 | 0.00 | ○ | 95 | 100 | 240 |
| Example 37 | 0.55 | 0.20 | 0.25 | 1.10 | 0.50 | ○ | 95 | 140 | 220 |
| Example 38 | 0.30 | 0.60 | 0.10 | 2.10 | 0.00 | ○ | 94 | 160 | 420 |
| Example 39 | 0.25 | 0.50 | 0.25 | 0.00 | 2.70 | ○ | 96 | 150 | 360 |

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 94% or higher as relative density in all the samples, which is a higher value than the samples in Examples 24 to 33, which were manufactured in the same method without manganese or copper. Then, the average equivalent circular diameter and the maximum equivalent circular diameter of crystal grains were evaluated in all the samples. The average equivalent circular diameter was 0.5 μm or larger and 4.0 μm or smaller, and the maximum equivalent circular diameter was 6.1 μm or larger and 10.0 μm or smaller. Further, as a result of the structure analysis using the TEM, the diffuse phase transition structure was confirmed in all the samples.

As to the electric characteristic, the piezoelectric constant $d_{33}$* was 100 (pm/V) or larger, and the Curie temperature was 200° C. or higher in all the samples.

Another example of BaTiO$_3$—BiFeO$_3$—Bi(Mg$_{0.5}$Ti$_{0.5}$)O$_3$

Examples 40 to 45, and Comparative Example 11

(Manufacturing Method)
Through the use of the same raw materials as in Examples 1 to 16, composition of Table 5 was achieved by weighing, and the sintered body was manufactured by the same method as in Examples 1 to 16.

(Structure Evaluation)
As to the polished sintered body, through the use of the same method as in Examples 1 to 39, the composition, the crystal structure, the density, and the average equivalent circular diameter and the maximum equivalent circular diameter of the crystal grains were evaluated.

(Electric Characteristic Evaluate)
The electric characteristic of the polished sintered body was evaluated by the same method as in Examples 1 to 39.

Results of those evaluations are shown in Table 5. In Table 5, composition columns x, y, and z indicate molar ratios of BaTiO$_3$, BiFeO$_3$, and Bi(Mg$_{0.5}$Ti$_{0.5}$)O$_3$, respectively. The crystal structure column indicates a state in which only the perovskite-type structure exists.

TABLE 5

| | Composition | | | Structure evaluation | | | | Electric characteristic | |
|---|---|---|---|---|---|---|---|---|---|
| | x | y | z | Crystal structure | Relative Density [%] | Average equivalent circular diameter [μm] | Maximum equivalent circular diameter [μm] | Piezoelectric constant $d_{33}$* [pm/V] | Curie temperature (° C.) |
| Example 40 | 0.20 | 0.15 | 0.65 | ○ | 91 | 3.9 | 8.4 | 160 | 320 |
| Example 41 | 0.20 | 0.20 | 0.60 | ○ | 91 | 4.2 | 9.7 | 150 | 330 |
| Example 42 | 0.20 | 0.30 | 0.50 | ○ | 90 | 6.7 | 14.2 | 115 | 400 |
| Example 43 | 0.10 | 0.15 | 0.75 | ○ | 91 | 7.5 | 13.9 | 180 | 350 |
| Example 44 | 0.10 | 0.23 | 0.67 | ○ | 92 | 7.1 | 12.5 | 160 | 400 |
| Example 45 | 0.10 | 0.30 | 0.60 | ○ | 91 | 6.6 | 11.7 | 130 | 420 |
| Comparative Example 11 | 0.05 | 0.25 | 0.70 | ○ | 84 | 7.5 | 17.1 | Cannot evaluate | Cannot evaluate |

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 90% or higher as relative density in all the samples. Then, the average equivalent circular diameter and the maximum equivalent circular diameter of crystal grains were evaluated in all the samples. The average equivalent circular diameter was 3.9 μm or larger and 7.5 μm or smaller, and the maximum equivalent circular diameter was 8.4 μm or larger and 13.7 μm or smaller. Further, as a result of the structure analysis using the TEM, the diffuse phase transition structure was confirmed in all the samples.

As to the electric characteristic, the piezoelectric constant $d_{33}$* was 100 (pm/V) or larger, and the Curie temperature was 200° C. or higher in all the samples.

Examples 46 to 51

Materials Containing Mn or Cu (Manufacturing Method)
Through the use of the same raw materials as in Examples 17 to 23, composition of Table 6 was achieved by weighing, and the sintered body was manufactured by the same method as in Examples 17 to 23.

(Structure Evaluation)

As to the polished sintered body, through the use of the same method as in Examples 1 to 45, the composition, the crystal structure, the density, and the average equivalent circular diameter and the maximum equivalent circular diameter of the crystal grains were evaluated.

(Electric Characteristic Evaluation)

The electric characteristic of the polished sintered body was evaluated by the same method as in Examples 1 to 45.

Results of those evaluations are shown in Table 6. In Table 6, composition columns x, y, and z indicate molar ratios of $BaTiO_3$, $BiFeO_3$, and $Bi(Mg_{0.5}Ti_{0.5})O_3$, respectively. In addition, Mn quantity and Cu quantity respectively indicate masses with respect to 100 parts by mass of $xBaTiO_3$-$yBiFeO_3$-$zBi(Mg_{0.5}Ti_{0.5})O_3$. Further, in the crystal structure column, a state in which only the perovskite-type structure exists is indicated by "○".

As to the electric characteristic, the piezoelectric constant $d_{33}$* was 100 (pm/V) or larger, and the Curie temperature was 200° C. or higher in all the samples.

Another Example of $BaTiO_3$—$BiFeO_3$—$Bi(Ni_{0.5}Ti_{0.5})O_3$

Examples 52 to 57, and Comparative Example 11

(Manufacturing Method)

Through the use of the same raw materials as in Examples 24 to 33, composition of Table 7 was achieved by weighing, and the sintered body was manufactured by the same method as in Examples 24 to 33.

(Structure Evaluation)

As to the polished sintered body, through the use of the same method as in Examples 1 to 51, the composition, the

TABLE 6

| | Composition | | | | Structure evaluation | Electric characteristic | | |
|---|---|---|---|---|---|---|---|---|
| | x | y | z | Mn quantity (mass %) | Cu quantity (mass %) | Crystal structure | Relative Density [%] | Piezoelectric constant $d_{33}$* [pm/V] | Curie temperature (° C.) |
| Example 46 | 0.20 | 0.15 | 0.65 | 0.05 | 0.00 | ○ | 94 | 170 | 320 |
| Example 47 | 0.20 | 0.20 | 0.60 | 0.00 | 0.05 | ○ | 95 | 165 | 330 |
| Example 48 | 0.20 | 0.30 | 0.50 | 0.50 | 0.00 | ○ | 94 | 130 | 400 |
| Example 49 | 0.10 | 0.15 | 0.75 | 0.60 | 0.50 | ○ | 95 | 190 | 350 |
| Example 50 | 0.10 | 0.23 | 0.67 | 3.00 | 0.00 | ○ | 96 | 170 | 400 |
| Example 51 | 0.10 | 0.30 | 0.60 | 0.00 | 3.00 | ○ | 94 | 150 | 420 |

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 94% or higher as relative density in all the samples, which is a higher value than that in Examples 40 to 45 without manganese or copper. Then, the average equivalent circular diameter and the maximum equivalent circular diameter of crystal grains were evaluated in all the samples. The average equivalent circular diameter was 3.1 μm or larger and 6.5 μm or smaller, and the maximum equivalent circular diameter crystal structure, the density, and the average equivalent circular diameter and the maximum equivalent circular diameter of the crystal grains were evaluated.

(Electric Characteristic Evaluation)

The electric characteristic of the polished sintered body was evaluated by the same method as in Examples 1 to 51.

Results of those evaluations are shown in Table 7. In Table 7, composition columns x, y, and z indicate molar ratios of $BaTiO_3$, $BiFeO_3$, and $Bi(Ni_{0.5}Ti_{0.5})O_3$, respectively. In the crystal structure column, a state in which only the perovskite-type structure exists is indicated by "○".

TABLE 7

| | | Composition | | | | Structure evaluation | | | Electric characteristic | |
|---|---|---|---|---|---|---|---|---|---|---|
| | Manufacturing method | x | y | z | Crystal structure | Relative Density [%] | Average equivalent circular diameter [μm] | Maximum equivalent circular diameter [μm] | Piezoelectric constant $d_{33}$* [pm/V] | Curie temperature (° C.) |
| Example 52 | A | 0.20 | 0.15 | 0.65 | ○ | 91 | 3.4 | 7.2 | 145 | 310 |
| Example 53 | A | 0.20 | 0.20 | 0.60 | ○ | 93 | 3.9 | 8.5 | 130 | 320 |
| Example 54 | A | 0.20 | 0.30 | 0.50 | ○ | 92 | 6.6 | 12.1 | 105 | 390 |
| Example 55 | A | 0.10 | 0.15 | 0.75 | ○ | 92 | 7.9 | 14.6 | 165 | 360 |
| Example 56 | A | 0.10 | 0.23 | 0.67 | ○ | 94 | 6.8 | 12.1 | 150 | 410 |
| Example 57 | A | 0.10 | 0.30 | 0.60 | ○ | 93 | 6.5 | 11.4 | 120 | 430 |
| Comparative Example 12 | A | 0.05 | 0.25 | 0.70 | ○ | 83 | 9.4 | 25.7 | Cannot calculate | Cannot calculate | was 8.2 μm or larger and 10.0 μm or smaller. Further, as a result of the structure analysis using the TEM, the diffuse phase transition structure was confirmed in all the samples.

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 90% or higher as relative density in all the samples. Then, the average equivalent circular diameter and the maximum equivalent circular diameter of crystal grains were evaluated in all the samples. The average equivalent circular diameter was 3.4 µm or larger and 7.9 µm or smaller, and the maximum equivalent circular diameter was 7.2 µm or larger and 14.6 µm or smaller. Further, as a result of the structure analysis using the TEM, the diffuse phase transition structure was confirmed in all the samples.

As to the electric characteristic, the piezoelectric constant $d_{33}*$ was 100 (pm/V) or larger, and the Curie temperature was 200° C. or higher in all the samples.

Examples 58 to 63

Materials Containing Mn or Cu (Manufacturing Method)

Through the use of the same raw materials as in Examples 34 to 39, composition of Table 8 was achieved by weighing, and the sintered body was manufactured by the same method as in Examples 34 to 39.

(Structure Evaluation)

As to the polished sintered body, through the use of the same method as in Examples 1 to 57, the composition, the crystal structure, the density, and the average equivalent circular diameter and the maximum equivalent circular diameter of the crystal grains were evaluated.

(Electric Characteristic Evaluation)

The electric characteristic of the polished sintered body was evaluated by the same method as in Examples 1 to 57.

Results of those evaluations are shown in Table 8. In Table 8, composition columns x, y, and z indicate molar ratios of $BaTiO_3$, $BiFeO_3$, and $Bi(Ni_{0.5}Ti_{0.5})O_3$, respectively. In addition, Mn quantity and Cu quantity respectively indicate masses with respect to 100 parts by mass of $xBaTiO_3$-$yBiFeO_3$-$zBi(Ni_{0.5}Ti_{0.5})O_3$. Further, in the crystal structure column, a state in which only the perovskite-type structure exists is indicated by "∘".

From a result of the fluorescent X-ray analysis, it was found that the composition was as weighed after sintering, too.

In the structure evaluation, it was found that only the perovskite-type structure existed in all the samples from the X-ray diffraction structure analysis. In addition, the density was 94% or higher as relative density in all the samples, which is a higher value than that in Examples 52 to 57 without manganese or copper. Then, the average equivalent circular diameter and the maximum equivalent circular diameter of crystal grains were evaluated in all the samples. The average equivalent circular diameter was 2.8 µm or larger and 6.5 µm or smaller, and the maximum equivalent circular diameter was 6.2 µm or larger and 9.8 µm or smaller. Further, as a result of the structure analysis using the TEM, the diffuse phase transition structure was confirmed in all the samples.

As to the electric characteristic, the piezoelectric constant $d_{33}*$ was 100 (pm/V) or larger, and the Curie temperature was 200° C. or higher in all the samples.

(Liquid Discharge Head According to Example 8)

Through the use of the same piezoelectric material as in Example 8, a liquid discharge head illustrated in FIGS. 3A and 3B was prepared. Ink discharge from the liquid discharge head in response to input electric signals was confirmed.

(Ultrasonic Motor According to Example 20)

Through the use of the same piezoelectric material as in Example 20, an ultrasonic motor illustrated in FIGS. 4A and 4B were prepared. The rotary behavior of the motor in response to application of an alternating voltage was confirmed.

(Dust Removing Device According to Example 30)

Through the use of the same piezoelectric material as in Example 30, a dust removing device illustrated in FIGS. 5A and 5B were prepared. When an alternating voltage was applied after spraying plastic beads, a satisfactory dust-removing rate was confirmed.

According to the present invention, it is possible to provide a piezoelectric material having high piezoelectric performance without ingredients harmful to the environment. In addition, the present invention can provide the piezoelectric element, the liquid discharge head, the ultrasonic motor, and the dust removing device, which use the piezoelectric material.

REFERENCE SIGNS LIST 101 piezoelectric element
102 individual liquid chamber
103 diaphragm
104 liquid chamber partition wall
105 discharge port
106 communicating hole
107 common liquid chamber
108 buffer layer
1011 first electrode
1012 piezoelectric material
1013 second electrode
201 transducer
202 rotor
203 output axis
204 transducer
205 rotor

TABLE 8

| | Composition | | | | | Structure evaluation | Electric characteristic | |
| --- | --- | --- | --- | --- | --- | --- | --- | --- |
| | x | y | z | Mn quantity (mass %) | Cu quantity (mass %) | Crystal structure | Relative Density [%] | Piezoelectric constant $d_{33}*$ [pm/V] | Curie temperature (° C.) |
| Example 58 | 0.20 | 0.15 | 0.65 | 0.50 | 0.00 | ∘ | 94 | 150 | 310 |
| Example 59 | 0.20 | 0.20 | 0.60 | 0.00 | 0.50 | ∘ | 96 | 140 | 320 |
| Example 60 | 0.20 | 0.30 | 0.50 | 0.90 | 0.00 | ∘ | 95 | 115 | 380 |
| Example 61 | 0.10 | 0.15 | 0.75 | 1.10 | 0.50 | ∘ | 95 | 170 | 350 |
| Example 62 | 0.10 | 0.23 | 0.67 | 2.10 | 0.00 | ∘ | 97 | 160 | 400 |
| Example 63 | 0.10 | 0.30 | 0.60 | 0.00 | 2.70 | ∘ | 96 | 130 | 420 |

206 spring
2011 elastic ring
2012 piezoelectric element
2013 organic adhesive
2041 metal elastic body
2042 laminated piezoelectric element
310 dust removing device
320 diaphragm
330 piezoelectric element
331 piezoelectric material
332 first electrode
333 second electrode
336 first electrode surface
337 second electrode surface While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-292819, filed Dec. 28, 2010, and Japanese Patent Application No. 2011-194072, filed Sep. 6, 2011, which are hereby incorporated by reference herein in their entirety.

The invention claimed is:

1. A piezoelectric material, comprising:
a perovskite-type metal oxide that is expressed by general formula (1):

$$xBaTiO_3\text{-}yBiFeO_3\text{-}zBi(M_{0.5}Ti_{0.5})O_3 \qquad (1),$$

where M represents at least one type of element selected from the group consisting of Mg and Ni, x satisfies 0.25≤x≤0.75, y satisfies 0.15≤y≤0.70, z satisfies 0.05≤z≤0.60, and x+y+z=1 is satisfied; or a perovskite-type metal oxide that is expressed by general formula (2):

$$xBaTiO_3\text{-}yBiFeO_3\text{-}zBi(M_{0.5}Ti_{0.5})O_3 \qquad (2),$$

where M represents at least one type of element selected from the group consisting of Mg and Ni, x satisfies 0.10≤x<0.25, y satisfies 0.15≤y≤0.30, z satisfies 0.45≤z≤0.75, and x+y+z=1 is satisfied.

2. The piezoelectric material according to claim 1, wherein x satisfies 0.25≤x≤0.55, y satisfies 0.20≤y≤0.70, and z satisfies 0.05≤z≤0.25 in the general formula (1).

3. The piezoelectric material according to claim 1, wherein the piezoelectric material contains at least one type of element selected from the group consisting of Mn and Cu at 0.05 mass % or higher and 3.0 mass % or lower.

4. The piezoelectric material according to claim 1,
wherein the piezoelectric material comprises a ceramic,
wherein an average equivalent circular diameter of crystal grains of the ceramic is 500 nm or larger and 5 μm or smaller, and
wherein a maximum equivalent circular diameter of the crystal grains is 5 μm or larger and 10 μm or smaller.

5. The piezoelectric material according to claim 1,
wherein the piezoelectric material comprises a ceramic, and
wherein crystal grains of the ceramic have a diffuse phase transition structure.

6. A piezoelectric element, comprising:
a first electrode;
a piezoelectric material; and
a second electrode,
wherein the piezoelectric material comprises the piezoelectric material according to claim 1.

7. A liquid discharge head, comprising:
a liquid chamber comprising a vibration portion including the piezoelectric element according to claim 6; and
a discharge port communicating to the liquid chamber.

8. An ultrasonic motor, comprising:
a vibration body including the piezoelectric element according to claim 6; and
a moving body that is in contact with the vibration body.

9. A dust removing device, comprising a vibration portion including the piezoelectric element according to claim 6.

10. A piezoelectric material, comprising a perovskite-type metal oxide that is expressed by general formula (3):

$$lBaTiO_3\text{-}mBiFeO_3\text{-}nBi(M_{0.5}Ti_{0.5})O_3 \qquad (3),$$

where M represents at least one type of element selected from the group consisting of Mg and Ni, l satisfies 0<l<1, m satisfies 0<m<1, n satisfies 0<n<1, and l+m+n=1 is satisfied,
wherein the piezoelectric material comprises a ceramic, and
wherein crystal grains of the ceramic have a diffuse phase transition structure.

11. A piezoelectric element, comprising:
a first electrode;
a piezoelectric material; and
a second electrode,
wherein the piezoelectric material comprises the piezoelectric material according to claim 10.

12. A liquid discharge head, comprising:
a liquid chamber comprising a vibration portion including the piezoelectric element according to claim 11; and
a discharge port communicating to the liquid chamber.

13. An ultrasonic motor, comprising:
a vibration body including the piezoelectric element according to claim 11; and
a moving body that is in contact with the vibration body.

14. A dust removing device, comprising a vibration portion including the piezoelectric element according to claim 11.

* * * * *